(12) United States Patent
Nah et al.

(10) Patent No.: US 11,175,524 B2
(45) Date of Patent: Nov. 16, 2021

(54) METHOD FOR FABRICATING CURVED DISPLAY DEVICE

(71) Applicant: KORTEK CORPORATION, Incheon (KR)

(72) Inventors: Keun Shik Nah, Bucheon-si (KR); Chan Hwan Kim, Incheon (KR)

(73) Assignee: KORTEK CORPORATION, Incheon (KR)

( * ) Notice: Subject to any disclaimer, the term of this patent is extended or adjusted under 35 U.S.C. 154(b) by 12 days.

(21) Appl. No.: 16/330,116

(22) PCT Filed: Aug. 9, 2017

(86) PCT No.: PCT/KR2017/008637
§ 371 (c)(1),
(2) Date: Mar. 4, 2019

(87) PCT Pub. No.: WO2018/048106
PCT Pub. Date: Mar. 15, 2018

(65) Prior Publication Data
US 2019/0235302 A1 Aug. 1, 2019

(30) Foreign Application Priority Data
Sep. 8, 2016 (KR) .......................... 10-2016-0115796

(51) Int. Cl.
*G02F 1/1333* (2006.01)
*G02F 1/1345* (2006.01)
(Continued)

(52) U.S. Cl.
CPC ...... *G02F 1/133305* (2013.01); *G02F 1/1345* (2013.01); *G06F 1/1652* (2013.01);
(Continued)

(58) Field of Classification Search
CPC ........... G02F 1/13452; G02F 1/133325; G02F 1/1345; G02F 1/133305; G02F 1/13454;
(Continued)

(56) References Cited

U.S. PATENT DOCUMENTS

| 2008/0088768 A1* | 4/2008 | Kohno | ................ G02F 1/13452 349/60 |
| 2013/0021768 A1* | 1/2013 | Kim | ........................ H01L 23/36 361/783 |
| 2015/0189768 A1* | 7/2015 | Kishida | .................. H05K 1/028 361/749 |

FOREIGN PATENT DOCUMENTS

| JP | 2001326244 A | 11/2001 |
| JP | 2010204535 A | 9/2010 |

(Continued)

OTHER PUBLICATIONS

PCT International Search Report corresponding to PCT/KR2017/008637 filed Aug. 9, 2017.

*Primary Examiner* — Thoi V Duong
(74) *Attorney, Agent, or Firm* — Schmeiser, Olsen & Watts, LLP

(57) ABSTRACT

Provided is a method of manufacturing a curved display device, wherein a tape automated bonding (TAB) tape, which includes a base film, a driving chip formed at an upper portion of the base film, a plurality of one-side outer leads formed to bond an output terminal of the driving chip and a terminal of a liquid crystal display (LCD) substrate by an outer lead bonding (OLB) method, and a plurality of the other-side outer leads formed to bond an input terminal of the driving chip and a terminal of a printed circuit board, is designed so that from the end of the OLB bonding part to the part at which the film begins to bend is greater than or equal to the longitudinal length (E) of the driving chip ((4F−D/2) ≥E).

4 Claims, 5 Drawing Sheets

(51) Int. Cl.
  G09F 9/30 (2006.01)
  H05K 1/14 (2006.01)
  H05K 1/18 (2006.01)
  G06F 1/16 (2006.01)
  H05K 3/36 (2006.01)

(52) U.S. Cl.
  CPC ............... *G09F 9/30* (2013.01); *H05K 1/14* (2013.01); *H05K 1/18* (2013.01); *H05K 3/361* (2013.01); *G02F 1/13454* (2013.01); *G02F 1/133325* (2021.01); *H05K 2201/10681* (2013.01)

(58) Field of Classification Search
  CPC .............. G02F 1/13458; G02F 1/1333; H05K 2201/10681; H05K 1/189; H05K 1/14; H05K 1/147; H05K 1/18; H05K 3/361; G06F 1/1652; G09F 9/30; G09F 9/301
  See application file for complete search history.

(56) References Cited

FOREIGN PATENT DOCUMENTS

| | | |
|---|---|---|
| KR | 100213449 | 8/1999 |
| KR | 100213449 B1 | 8/1999 |
| KR | 100476533 | 6/2006 |
| KR | 100476533 B1 | 6/2006 |
| KR | 20060126174 A | 12/2006 |
| KR | 20120030732 A | 3/2012 |

\* cited by examiner

METHOD FOR FABRICATING CURVED DISPLAY DEVICE

CROSS-REFERENCE TO RELATED APPLICATIONS

This application claims priority to PCT Application No. PCT/KR2017/008637, having a filing date of Aug. 9, 2017, based on KR 10-2016-0115796, having a filing date of Sep. 8, 2016, the entire contents both of which are hereby incorporated by reference.

FIELD OF TECHNOLOGY

The following relates to a method of manufacturing a curved display device, and more particularly, to a method of manufacturing a curved display device capable of preventing a bonded tape automated bonding (TAB) tape from falling off due to a tensile force when a driving chip is mounted on a curved liquid crystal display (LCD) panel using the TAB tape.

BACKGROUND

Generally, a tape automated bonding (TAB) technology is a technology in which a driving chip (for example, a TAB integrated chip (IC)) is mounted in order to enlarge an effective display area of a liquid crystal display (LCD) panel as much as possible or form a thin module.

The TAB technology is a technology for a reel-to-reel type continuous operation in a package assembly process and is generally referred to as TAB package (or TAB tape). The TAB package may be classified into a chip-on-film (COF) package and a tape carrier package (TCP).

Here, the TCP has a device hole for mounting a driving chip (driver IC) in a base film (for example, polyimide tape), but the COF is a packaging method in which the driving chip is formed on the base film without the device hole. In such TAB technologies, according to material characteristics of a terminal of the driving chip (driver IC), which is formed of a metal material, and an LCD panel (glass substrate), which is formed of a glass material, outer leads of the TCP or COF and an electrode of a glass substrate (or a connection terminal of a printed circuit board) are bonded by an outer lead bonding (OLB) method using an anisotropic conductive film (ACF) instead of lead as illustrated in FIGS. 1(a)-(c).

FIGS. 1(a)-(c) is an exemplary view for describing general characteristics of a TAB tape bonded by a conventional OLB method, FIGS. 2A-B is an exemplary view illustrating shapes of the TAB tape illustrated in FIGS. 1(a)-(c) being bonded to a flat LCD panel and a printed circuit board seen from the front and the side, and FIG. 3 is an exemplary view illustrating shapes of the TAB tape illustrated in FIGS. 1(a)-(c) being bonded to a curved LCD panel and a printed circuit board seen from the front and the side.

As illustrated in FIGS. 2(a)-(b), when one-side outer leads of the TAB tape are bonded to a glass substrate of the LCD panel, and the other side outer leads are bonded to the printed circuit board (or a flexible printed circuit board), the TAB tape is bent as the glass substrate and the printed circuit board are adhered to each other.

In this way, when the LCD panel to which the TAB tape is bonded is flat, since the TAB tape is curved or bent only in one direction and thus a great force does not act on bonding surfaces (that is, OLB bonding parts) at the both sides, there is no concern that the bonded TAB tape would fall off.

However, as illustrated in FIGS. 3(a)-(b), when the LCD panel has a curved surface (for example, a concave or convex curved surface), since the TAB tape has to be curved or bent in two directions (perpendicular directions), a great tensile force acts on bonding surfaces (particularly, OLB bonding parts bonded to an inner side of the curved surface) at the both sides, and there may be a problem in that the bonded TAB tape falls off with time. As a result, there is a problem in that, when the bonded TAB tape falls off or is folded, this may lead to a failure of the LCD panel.

The known art has been disclosed in Korean Patent Registration No. 10-0213449 (Date of Registration: May 13, 1999, Title: Structure of tab package for preventing short).

SUMMARY

An aspect relates to a method of manufacturing a curved display device capable of preventing a bonded tape automated bonding (TAB) tape from falling off due to a tensile force when a driving chip is mounted on a curved liquid crystal display (LCD) panel using the TAB tape.

In a method of designing a tape automated bonding (TAB) tape for preventing a bonding part from falling off according to an aspect of embodiments of the present invention, a TAB tape, which includes a base film, a driving chip formed at an upper portion of the base film, a plurality of one-side outer leads formed to bond an output terminal of the driving chip and a terminal of a liquid crystal display (LCD) substrate by an outer lead bonding (OLB) method, and a plurality of the other-side outer leads formed to bond an input terminal of the driving chip and a terminal of a printed circuit board by the OLB method, is designed so that a longitudinal length (E) of the driving chip is less than or equal to half ($\frac{1}{2}$) of a longitudinal length (D) of the TAB tape excluding the outer lead portion (E≤D/2), a transverse length (B) of the driving chip is less than or equal to half ($\frac{1}{2}$) of a transverse length (A) of the TAB tape (B≤A/2), the longitudinal length (D) of the TAB tape excluding the outer lead portion is greater than or equal to the quadruple of a length (F) from an end of an OLB bonding part to a part at which the film begins to bend (D≥4F), and a length which results from subtracting the half ($\frac{1}{2}$) of the longitudinal length (D) of the TAB tape excluding the outer lead portion from the quadruple of the length (F) from the end of the OLB bonding part to the part at which the film begins to bend is greater than or equal to the longitudinal length (E) of the driving chip ((4F−D/2)≥E).

A longitudinal length (C) of the TAB tape may be longer than the longitudinal length (D) of the TAB tape excluding the outer lead portion (C>D).

The TAB tape may be designed so that a tensile force concentrated at the OLB bonding part is distributed.

The TAB tape may be designed on the basis of a size of the driving chip (TAB IC), sizes of the outer leads, and a direction in which a tensile force is generated when the TAB tape is bent.

The TAB tape may be designed by calculating a size through mathematical simulations and verifying the calculated size through repeated experiments.

According to an aspect of embodiments of the present invention, when a driving chip is mounted on a liquid crystal display (LCD) panel using a tape automated bonding (TAB) tape, the bonded tape can be prevented from falling off due to a tensile force.

BRIEF DESCRIPTION

Some of the embodiments will be described in detail, with reference to the following figures, wherein like designations denote like members, wherein.

Figure 4:
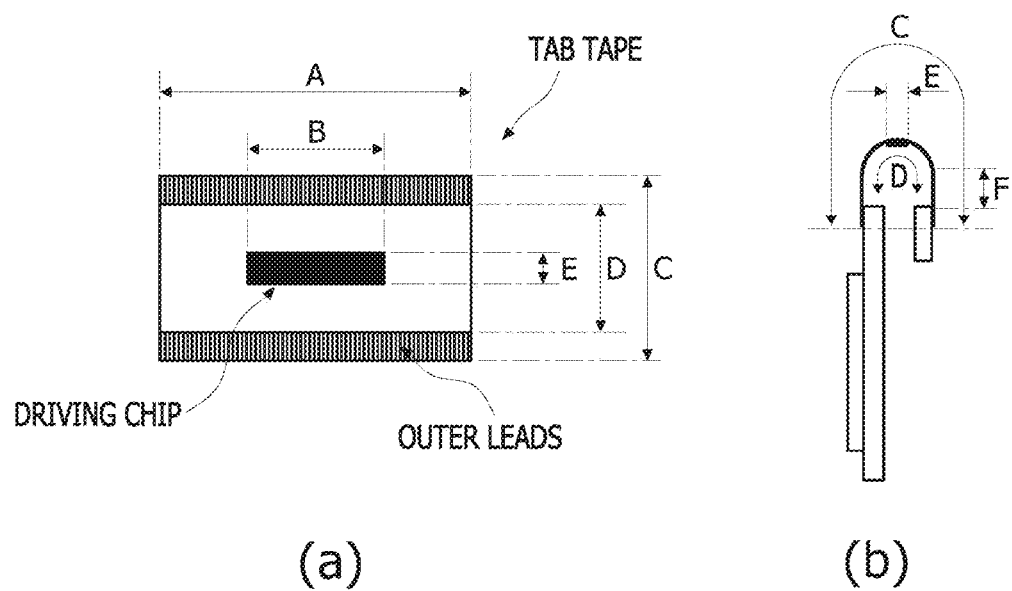
FIG. 4(a) is an exemplary view showing defined sizes seen from the front for describing a method of manufacturing a curved display device related to embodiments of the present invention.
FIG. 4(b) is an exemplary view showing defined sizes seen from the side for describing a method of manufacturing a curved display device related to embodiments of the present invention.
Figure 5:
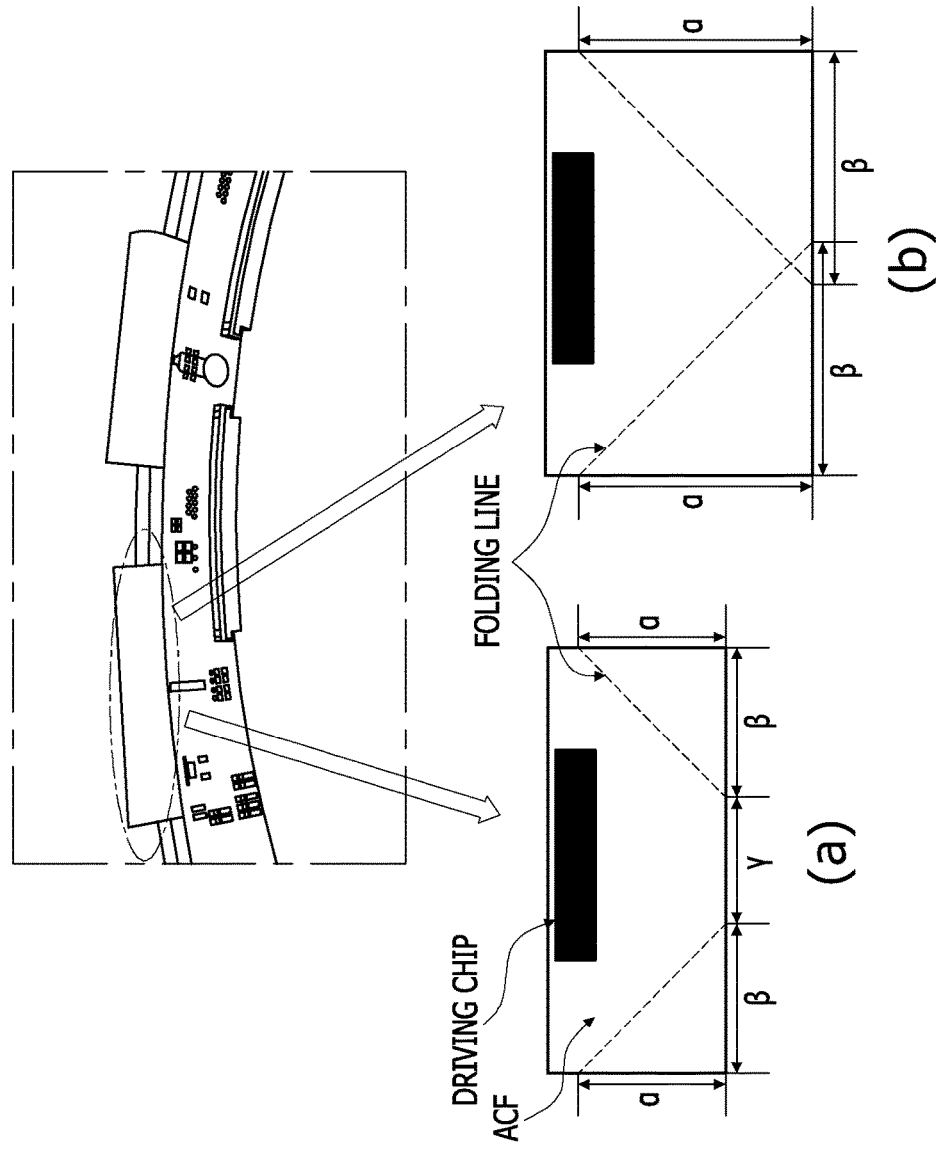

FIG. 5(a) is an exemplary view for describing a method of designing a TAB tape so that, when the TAB tape is bonded to a curved LCD panel and a printed circuit board and bent in a second direction as illustrated in FIGS. 4(a)-(b), an OLB bonding part does not fall off in relation to a portion at which folding occurs; and FIG. 5(b) is an exemplary view for describing a method of designing a TAB tape so that, when the TAB tape is bonded to a curved LCD panel and a printed circuit board and bent in a second direction as illustrated in FIGS. 4(a)-(b), an OLB bonding part does not fall off in relation to a portion at which folding occurs.

DETAILED DESCRIPTION

Hereinafter, an embodiment of a method of manufacturing a curved display device according to embodiments of the present invention will be described with reference to the accompanying drawings.

In this process, thicknesses of lines, sizes of elements, or the like illustrated in the drawings may have been exaggerated for clarity and convenience of description. Terms which will be described below are terms defined in consideration of functions in embodiments of the present invention and may vary according to intensions or practices of a user or an operator. Therefore, such terms should be defined on the basis of content throughout the present specification.

FIGS. 4(a)-(b) is an exemplary view showing defined sizes seen from the front and the side for describing a method of manufacturing a curved display device related to an embodiment of embodiments of the present invention, and FIGS. 5(a)-(b) is an exemplary view for describing a method of designing a TAB tape so that, when the TAB tape is bonded to a curved LCD panel and a printed circuit board and bent in a second direction as illustrated in FIGS. 4(a)-(b), an OLB bonding part does not fall off in relation to a portion at which folding occurs.

FIG. 4(a) shows the sizes when the TAB tape is seen from the front before being bent, and FIG. 4(b) shows the sizes when the TAB tape, which is bent due to both sides being bonded by an OLB method, is seen from the side. As illustrated in FIGS. 4(a) and 4(b), a transverse length of the TAB tape is defined as "A," a transverse length of a driving chip (TAB IC) is defined as "B," a longitudinal length of the TAB tape is defined as "C," a longitudinal length of the TAB tape excluding an outer lead portion is defined as "D," and a longitudinal length of the driving chip (TAB IC) is defined as "E."

In this case, when the TAB tape is bonded to the printed circuit board and then joined to the curved LCD panel, the TAB tape is bent according to the shape of the curved LCD panel as illustrated in FIGS. 5(a)-(b) such that the TAB tape receives a tensile force around folding lines illustrated in FIGS. 5(a) and 5(b).

FIGS. 5(a) and 5(b) are exemplary views for describing the fact that tensile forces around folding lines that act on TAB tapes differ when sizes (for example, longitudinal lengths) of the TAB tapes differ.

Referring to FIGS. 5(a) and 5(b), it can be seen that, as the longitudinal length of the TAB tape increases, a transverse length (that is, outer leads bonded by the OLB method) affected by the tensile force also increases.

Figure 1:
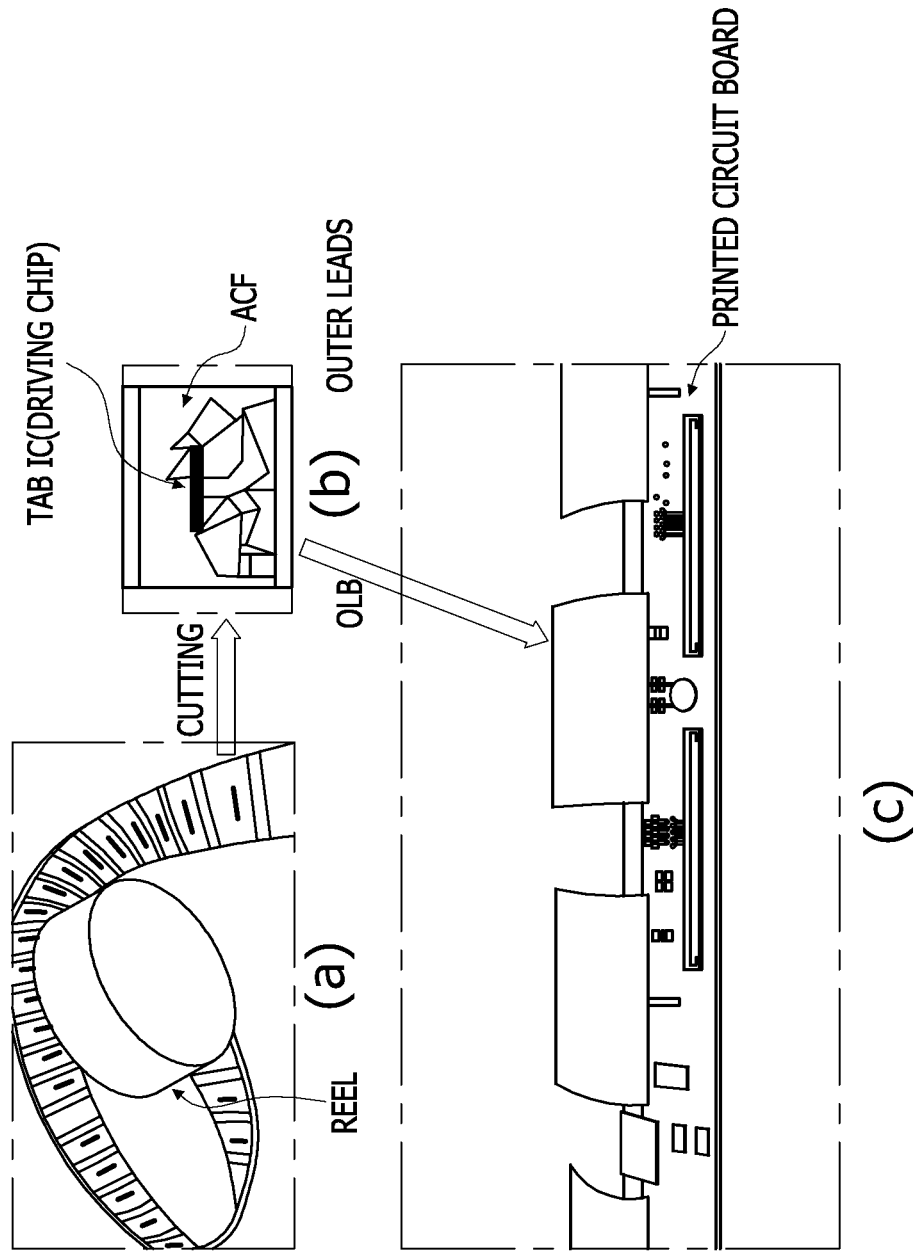
FIG. 1(a) is an exemplary view for describing general characteristics of a tape automated bonding (TAB) tape bonded by a conventional outer lead bonding (OLB) method.
FIG. 1(b) is an exemplary view for describing general characteristics of a tape automated bonding (TAB) tape bonded by a conventional outer lead bonding (OLB) method.
FIG. 1(c) is an exemplary view for describing general characteristics of a tape automated bonding (TAB) tape bonded by a conventional outer lead bonding (OLB) method.
Figure 2:
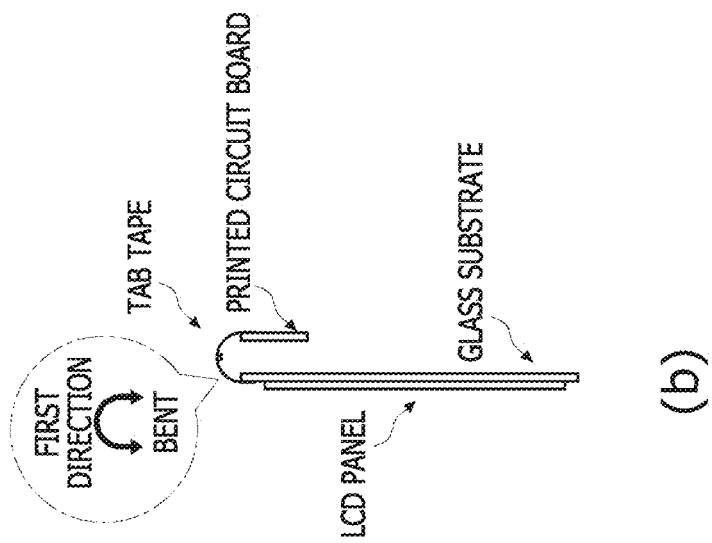
FIG. 2(a) is an exemplary view illustrating shapes of the TAB tape illustrated in FIGS. 1A-C being bonded to a flat liquid crystal display (LCD) panel and a printed circuit board seen from the front.
FIG. 2(b) is an exemplary view illustrating shapes of the TAB tape illustrated in FIGS. 1A-C being bonded to a flat liquid crystal display (LCD) panel and a printed circuit board seen from the side.
Figure 2:
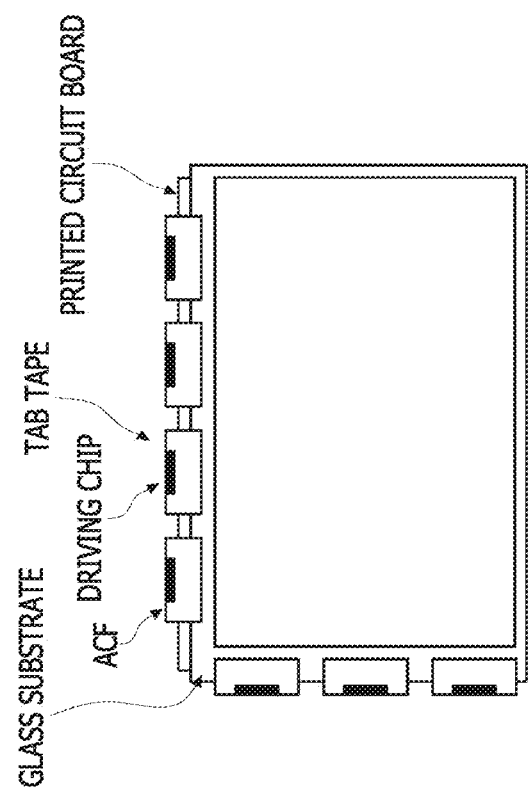
Figure 3:
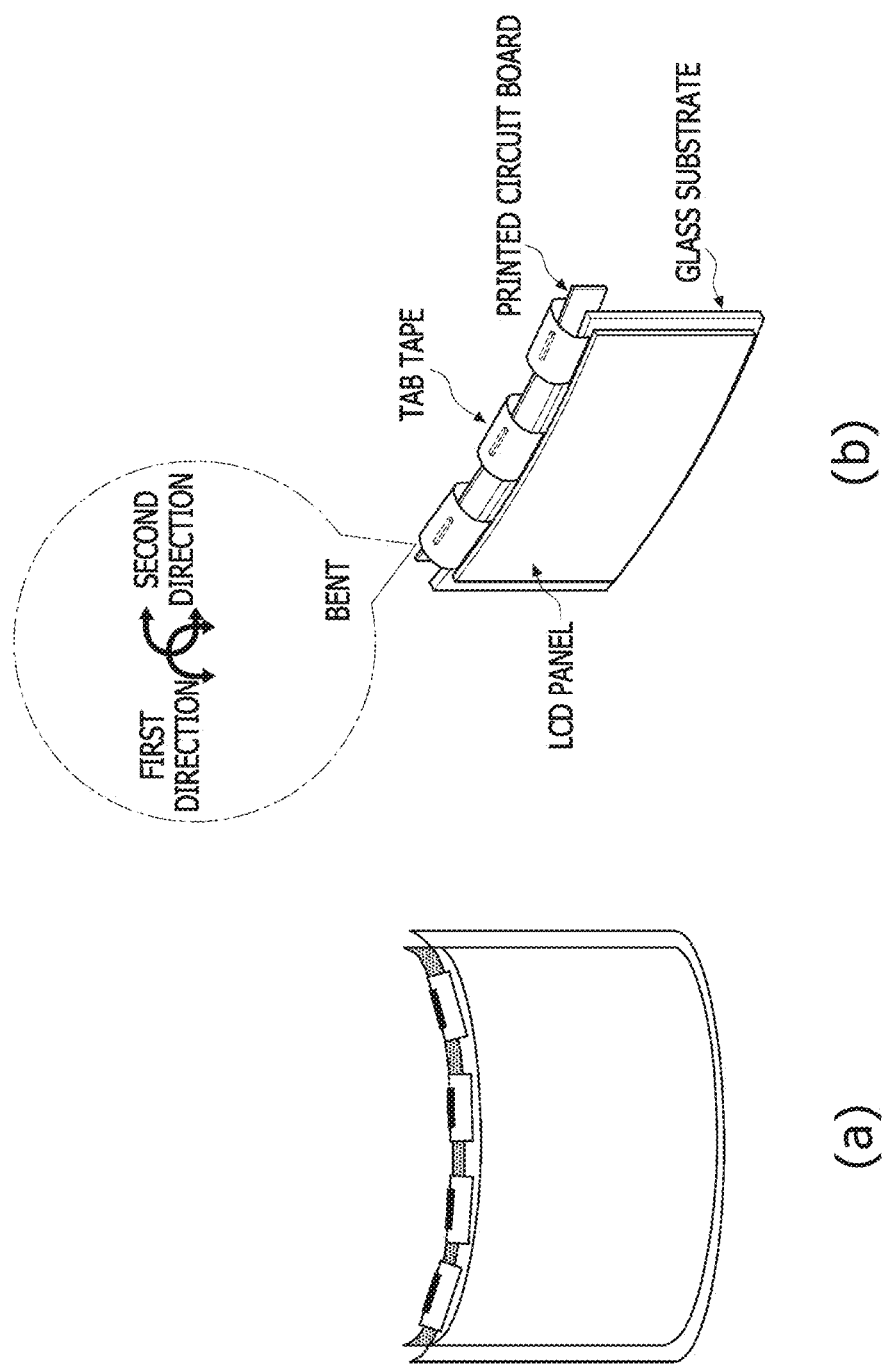
FIG. 3(a) is an exemplary view illustrating shapes of the TAB tape illustrated in FIGS. 1(a)-(c) being bonded to a curved LCD panel and a printed circuit board seen from the front.
FIG. 3(b) is an exemplary view illustrating shapes of the TAB tape illustrated in FIGS. 1A-C being bonded to a curved LCD panel and a printed circuit board seen from the side.

When the TAB tape is bent (bent in a second direction (see FIGS. 3(a)-(b)) in FIGS. 5(a) and 5(b), an isosceles triangle in which lengths of two sides are equal ($\alpha=\beta$) is drawn when a virtual triangle, which has a folding line as its hypotenuse, is drawn. In this case, the lengths of the two sides ($\alpha=\beta$) of the virtual triangle are shortened when the longitudinal length of the TAB tape is short. Conversely, the lengths of the two sides ($\alpha=\beta$) of the virtual triangle becomes longer when the longitudinal length of the TAB tape is long.

As described above, since the transverse length (that is, the outer leads bonded by the OLB method) affected by the tensile force becomes longer as the lengths of the two sides ($\alpha=\beta$) of the virtual triangle becomes longer, a problem in that the TAB tape falls off may occur.

When the TAB tape is bent as described above, generally, the lengths of the two sides ($\alpha=\beta$) are approximately equal when a virtual triangle, which has a folding line as its hypotenuse, is drawn. Also, as a gap ($\gamma$) between virtual triangles, which are virtually formed at lower ends at both sides of the TAB tape, becomes longer, that is, as the length of a longitudinal side ($\alpha$) is shorter, a force (that is, tensile force) actually concentrated at an OLB bonding part increases, and thus the possibility that the state of the OLB bonding part will become unstable is high.

Conversely, when, as the length of the longitudinal side ($\alpha$) becomes longer, the gap ($\gamma$) between the virtual triangles becomes shorter and finally disappears, it can be seen that a force (that is, tensile force) actually concentrated at an OLB bonding part decreases (that is, is distributed), and thus the possibility that the state of the OLB bonding part will become unstable is minimized.

For reference, the length of the longitudinal side ($\alpha$) of the virtual triangle is equal to the length (F) in FIGS. 4(a)-(b).

Therefore, in order to prevent the OLB bonding part of the TAB tape from falling off, there is a need to design the TAB tape such that a force (that is, tensile force) concentrated at an OLB bonding part is decreased (that is, distributed). That is, there is a need to design a size of an anisotropic conductive film (ACF) in consideration of a size of the driving chip (TAB IC), sizes of the outer leads, and a direction in which the tensile force is generated when the TAB tape is bent.

The size of the ACF was calculated through mathematical simulations, and the size was verified through repeated experiments.

For example, a longitudinal length (E) of the driving chip (TAB IC) has to be less than or equal to half (½) of a longitudinal length (D) of the TAB tape excluding the outer lead portion (E≤D/2), a transverse length (B) of the driving chip (TAB IC) has to be less than or equal to half (½) of a transverse length (A) of the TAB tape (B≤A/2), the longitudinal length (D) of the TAB tape excluding the outer lead portion has to be greater than or equal to the quadruple of a length (F) from an end of an OLB bonding part to a part at which the film begins to bend (D≥4F), and a length which results from subtracting the half (½) of the longitudinal length (D) of the TAB tape excluding the outer lead portion from the quadruple of the length (F) from the end of the OLB bonding part to the part at which the film begins to bend has to be greater than or equal to the longitudinal length (E) of the driving chip (TAB IC) ((4F−D/2)≥E). Here, a longitudinal length (C) of the TAB tape has to be greater than the longitudinal length (D) of the TAB tape excluding the outer lead portion (C>D).

By designing the size of the ACF in consideration of the size of the driving chip (TAB IC), the sizes of the outer leads, and the direction in which the tensile force is generated when the TAB tape is bent as described above, the present embodiment may obtain an effect of preventing the OLB bonding part of the TAB tape from falling off by causing the force (that is, the tensile force) actually concentrated at the OLB bonding part to be decreased (that is, distributed).

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method of manufacturing a curved display device, wherein a tape automated bonding (TAB) tape, which includes a base film, a driving chip formed at an upper portion of the base film, a plurality of one-side outer leads formed to bond an output terminal of the driving chip and a terminal of a liquid crystal display (LCD) substrate by an outer lead bonding (OLB) method, and a plurality of the other-side outer leads formed to bond an input terminal of the driving chip and a terminal of a printed circuit board by the OLB method, is designed so that a longitudinal length (E) of the driving chip is less than or equal to half (½) of a longitudinal length (D) of the TAB tape excluding the outer lead portion (E≤D/2), a transverse length (B) of the driving chip is less than or equal to half (½) of a transverse length (A) of the TAB tape (B≤A/2), the longitudinal length (D) of the TAB tape excluding the outer lead portion is greater than or equal to the quadruple of a length (F) from an end of an OLB bonding part to a part at which the film begins to bend (D≥4F), and a length which results from subtracting the half (½) of the longitudinal length (D) of the TAB tape excluding the outer lead portion from the quadruple of the length (F) from the end of the OLB bonding part to the part at which the film begins to bend is greater than or equal to the longitudinal length (E) of the driving chip ((4F−D/2)≥E);

wherein the TAB tape is designed on the basis of a size of the driving chip (TAB IC), sizes of the outer leads, and a direction in which a tensile force is generated when the TAB tape is bent;

wherein the transverse length (A) is equal to two times of the length (F) from the end of the OLB bonding part to the part at which the film begins to bend.

2. The method of claim 1, wherein a longitudinal length (C) of the TAB tape is longer than the longitudinal length (D) of the TAB tape excluding the outer lead portion (C>D).

3. The method of claim 1, wherein the TAB tape is designed so that a tensile force concentrated at the OLB bonding part is distributed.

4. The method of claim 1, wherein the TAB tape is designed by calculating a size through mathematical simulations and verifying the calculated size through repeated experiments.

* * * * *